United States Patent
Li et al.

(10) Patent No.: US 7,612,614 B2
(45) Date of Patent: Nov. 3, 2009

(54) DEVICE AND METHOD FOR BIASING A TRANSISTOR AMPLIFIER

(75) Inventors: Ping Wai Li, Shatin (HK); Cong Ke Li, Shatin (HK); Wei Wang, Shatin (HK)

(73) Assignee: Kontel Data System Ltd., Shatin (HK)

( * ) Notice: Subject to any disclaimer, the term of this patent is extended or adjusted under 35 U.S.C. 154(b) by 0 days.

(21) Appl. No.: 12/416,538

(22) Filed: Apr. 1, 2009

(65) Prior Publication Data

US 2009/0184770 A1 Jul. 23, 2009

Related U.S. Application Data

(63) Continuation-in-part of application No. 11/774,986, filed on Jul. 9, 2007, now Pat. No. 7,532,074.

(51) Int. Cl.
*H03F 3/04* (2006.01)
(52) U.S. Cl. .................................. 330/296; 330/285
(58) Field of Classification Search .................. 330/296, 330/285, 289, 298, 207 P, 261
See application file for complete search history.

(56) References Cited

U.S. PATENT DOCUMENTS

| | | | |
|---|---|---|---|
| 7,009,453 B2* | 3/2006 | Kuriyama | 330/289 |
| 7,332,968 B2* | 2/2008 | Luo | 330/296 |
| 7,355,480 B2* | 4/2008 | Honda | 330/296 |
| 7,358,817 B2* | 4/2008 | Kao et al. | 330/296 |
| 7,365,604 B2* | 4/2008 | Luo et al. | 330/296 |

FOREIGN PATENT DOCUMENTS

| | | |
|---|---|---|
| CN | 1374754 A | 10/2002 |
| JP | 7-31149 | 1/1995 |
| JP | 7-244111 | 9/1995 |
| JP | 8-66011 | 3/1996 |

OTHER PUBLICATIONS

Fürst, Claus Erdmann. "A Low-Noise/Low-Power Preamplifier for Capacitive Microphones," IEEE, 1996, pp. 477-480, 0-7803-3073-0/96.

Bernabé Linares-Barranco, On the Design and Characterization of Femtoampere Current-mode Circuits, IEEE Journal of Solid-State Circuits, vol. 38, No. 8, 2003.

\* cited by examiner

*Primary Examiner*—Henry K Choe
(74) *Attorney, Agent, or Firm*—George G. Wang; Wilkinson & Grist

(57) ABSTRACT

Provided is circuitry for biasing a transistor amplifier with a DC-voltage signal, the transistor amplifier having a first input terminal, a second input terminal, and an output terminal coupled to the second input terminal. The circuitry includes a sensor capacitor connected to the first input terminal and an impedance transistor arranged in parallel with said capacitor, the transistor and capacitor forming a low-pass filter. The circuitry also includes a biasing circuit configured to controllably vary a DC-voltage signal for operatively biasing the amplifier, the biasing circuit including a cascaded current arrangement configured to subdivide a reference current into smaller currents for selectively generating voltage potentials for biasing the impedance transistor to adjustably filter a noise component of the DC-voltage signal via the low-pass filter before the DC-voltage signal is provided to the first input terminal.

13 Claims, 7 Drawing Sheets

DEVICE AND METHOD FOR BIASING A TRANSISTOR AMPLIFIER

CROSS-REFERENCE TO RELATED APPLICATIONS

This is a continuation-in-part of prior U.S. patent application Ser. No. 11/744,986, filed on Jul. 9, 2007, which is incorporated herein by reference in its entirety.

TECHNICAL FIELD

The present invention relates to an apparatus and method for biasing a transistor amplifier and in particular, FET transistor amplifiers which are fabricated on integrated circuit chips.

BACKGROUND OF THE INVENTION

Metal Oxide Semiconductor Field Effect Transistors (MOSFETs) and Junction Field Effect Transistors (JFETs) are often used as the building blocks of low-noise amplifier devices fabricated on integrated circuit chips. Such amplifiers are useful for instance in audio applications, capacitive sensor applications, and thermal sensor detection applications where it is important to minimise the adverse effects of noise arising from, amongst other things, a DC-voltage bias source, and electronic elements that comprise such DC-voltage biasing circuitry.

Amplifiers which are built from MOSFETs and JFETs tend to have very large input impedances by design, in order to minimise noise. As such, it is important that the biasing circuitry also has a biasing impedance which is generally similar to the input impedance of the amplifier to ensure efficient operation of the amplifier under the well-known practice of impedance matching. The relatively high impedance of the biasing circuitry may also be utilised in combination with a capacitor to form a low-pass filter which may be used to filter out noise arising from the biasing circuitry.

FIG. 3 shows an example of a prior art biasing network which is arranged in parallel with a capacitor (C) so that it simultaneously provides low-pass filtering at the input of an amplifier. FIG. 4 graphically represents the relationship between the noise output (kT/C) of the biasing network in parallel with the capacitor (C) as a function of impedance, where k is the Boltzmann constant, T the absolute temperature and C the value of capacitor (C).

Ideally, the bandwidth of noise arising from the biasing network shown in FIG. 3 is controlled by either adjusting the value of the capacitor (C) or the impedance. As shown in FIG. 4, increasing the capacitance C or the impedance will lead to a lower level of noise. In one application of the network shown in FIG. 3, capacitance C is represented by a transducer, such as a microphone, a capacitive sensor, or the like. Accordingly, because the magnitude of the capacitor (C) is limited by the transducer's design, the bandwidth of the noise is limited by increasing the magnitude of the impedance (typically in the tens of Giga-Ohms). However, where the biasing network is to be implemented on an integrated circuit, it is extremely difficult to provide a high impedance value in an area-efficient manner. A large conventional impedance value typically requires a relatively large area an integrated circuit layout, which may not always be available or practical.

SUMMARY OF THE INVENTION

The present invention seeks to alleviate at least one of the problems described above associated with the prior art.

The present invention involves several different broad forms. Embodiments of the invention may include one or any combination of the different broad forms herein described.

In a first broad form, the present invention provides a device for use in biasing a transistor amplifier with a DC-voltage signal, the transistor amplifier including:
 a first input terminal;
 a second input terminal; and
 an output terminal coupled to the second input terminal;
 wherein said device includes:
  a biasing circuit adapted for operative coupling to the first input terminal so as to provide a relatively high biasing impedance to ground at the first input terminal, said biasing circuit being adapted to controllably vary the DC-voltage signal which biases the transistor amplifier, whilst at least one component of the biasing circuit is configured to simultaneously form a low-pass circuit for filtering a noise component of the DC-voltage signal before the DC-voltage signal is provided to the first input terminal.

Typically, the transistor amplifier may include a CMOS amplifier. Also typically, the CMOS amplifier may include at least one of a MOSFET and a JFET.

Preferably, the first input terminal includes a positive input terminal of the transistor amplifier, and, the second input terminal includes a negative input terminal of the transistor amplifier.

Preferably, the biasing circuit includes a resistor-divider for controllably varying the DC-voltage signal.

Preferably, the biasing circuit also includes a sub-circuit adapted to mirror the DC-voltage signal produced by the resistor-divider at an output node of the sub-circuit. More preferably, the sub-circuit includes at least one of a diode, a MOSFET and a JFET. Typically, the diode, MOSFET and JFET include at least one of a p-n and Schottky-type diode, MOSFET and JFET respectively.

Preferably, the low-pass circuit may include a capacitor operatively coupled with at least one of a diode, a MOSFET, and a JFET of the biasing circuit, wherein the capacitor forms a first low-pass filter with an impedance of the at least one diode, MOSFET and JFET.

Preferably, the present invention includes a control current source adapted to automatically trigger adjustment of an impedance of at least one of a diode, MOSFET and JFET of the sub-circuit whereby said adjustment configures the sub-circuit to mirror the DC-voltage signal of the resistor-divider at the output node of the sub-circuit. Typically, the control current source is variable by reference to an output of the resistor-divider.

Typically, a capacitive sensor may be operatively coupled to the first input terminal of the transistor amplifier. Preferably the capacitive sensor may be coupled in parallel with the biasing circuit.

Typically, the capacitive sensor may include a capacitive sensor of a microphone. Also typically, the capacitive sensor may be adapted to receive a supply voltage signal from a voltage-multiplier device in series with the capacitive sensor.

Preferably, a second low-pass filter may be operatively coupled between the voltage multiplier device and the capacitive sensor. The second low-pass filter may be adapted to filter out a voltage ripple in the supply voltage signal before the supply voltage signal is fed to the capacitive sensor, the voltage ripple being produced during voltage step-up conversion of the supply voltage signal by the voltage multiplier device.

Preferably, the low-pass filter includes a capacitor operatively coupled with a first and second diode, said first and second diodes being coupled in parallel between a terminal of the capacitor and an output terminal of the voltage multiplier device, said first and second diodes being arranged in reverse polarity relative to each other whilst in the parallel configuration.

Typically, the sub-circuit of the biasing circuit may include a PMOS and an NMOS MOSFET, wherein the drains or sources of the PMOS and NMOS MOSFETs are operatively coupled to the first input terminal of the transistor amplifier, and gates of the PMOS AND NMOS MOSFETS are operatively coupled to different voltage potentials of the resistor-divider.

Preferably, at least one of the PMOS and NMOS MOSFETS are adapted to form a low-pass filter with the capacitive sensor coupled to the first input terminal of the transistor amplifier.

Typically, the device may be fabricated on an integrated circuit chip. Also typically, the device may be fabricated on the integrated circuit chip using a MEMS fabrication process.

In a second broad form, the present invention provides a low-pass filter adapted for use in filtering out a voltage ripple in a supply voltage signal, the voltage ripple being generated by a voltage multiplier device during voltage step-up conversion of the supply voltage signal before said supply voltage signal is fed to a capacitive sensor, the low-pass filter including a capacitor operatively coupled with a first and second diode, said first and second diodes being adapted for operative coupling in parallel between a terminal of the capacitor and an output terminal of the voltage multiplier device, said first and second diodes being arranged in reverse polarity relative to each other in parallel.

Preferably, the low-pass filter is fabricated on an integrated circuit chip.

Preferably, the capacitive sensor and the voltage multiplier device are fabricated on the integrated circuit chip. More preferably, the low-pass filter is fabricated on the integrated circuit chip using a MEMS fabrication process.

In a third broad form, the present invention provides a transistor amplifier including:
a first input terminal;
a second input terminal;
an output terminal coupled to the second input terminal; and
a biasing circuit adapted for operative coupling to the first input terminal so as to provide a relatively high biasing impedance to ground at the first input terminal, said biasing circuit being adapted to controllably vary a DC-voltage signal which biases the transistor amplifier, whilst at least one component of the biasing circuit is configured to simultaneously form a low-pass circuit for filtering a noise component of the DC-voltage signal before the DC-voltage signal is provided to the first input terminal.

In a fourth broad form, the present invention provides a method of biasing a transistor amplifier with a DC-voltage signal, the transistor amplifier including:
a first input terminal;
a second input terminal; and
an output terminal coupled to the second input terminal;
wherein the method includes the steps of:
(a) operatively coupling a biasing circuit to the first input terminal, wherein said biasing circuit is adapted to provide a relatively high biasing impedance to ground at the first input terminal;
(b) selectably adjusting the DC-voltage signal with the biasing circuit, wherein at least one component of the biasing circuit is configured to simultaneously form a low-pass circuit for filtering a noise component of the DC-voltage signal before the DC-voltage signal is provided to the first input terminal.

It would be appreciated by a person skilled in the art that at least one advantage of the present invention is in providing a biasing circuit for an amplifier which simultaneously provides a high impedance to ground, a variable biasing voltage, and a low-pass filter which assists in filtering out noise from the bias voltage applied to the amplifier input. This may be particularly advantageous in the context of MEMS technology where spatial limitations on integrated circuit chips must be taken into consideration and it is impractical to fabricate separate circuits dedicated to providing each of the above functions.

In a fifth broad form, the present invention provides circuitry for biasing a transistor amplifier with a DC-voltage signal, the transistor amplifier having a first input terminal, a second input terminal, and an output terminal coupled to the second input terminal, wherein said circuitry comprises:
a sensor capacitor connected to the first input terminal;
an impedance transistor arranged in parallel with said capacitor, the transistor and capacitor forming a low-pass filter; and
a biasing circuit configured to controllably vary the DC-voltage signal for operatively biasing the amplifier, the biasing circuit including a cascaded current arrangement configured to subdivide a reference current into smaller currents for selectively generating voltage potentials for biasing the impedance transistor to adjustably filter a noise component of the DC-voltage signal via the low-pass filter before the DC-voltage signal is provided to the first input terminal.

Typically, the cascaded current arrangement includes a number of transistor cells to facilitate subdivision of a reference current $I_{REF}$ by m number of stages to $I_{REF}/N_{M-1}$.

Typically, each transistor cell includes two transistors $M_1$ and $M_2$ arranged in parallel with a transistor $M_{s1}$ having a W/L ratio of N/N−1, where N is the ratio of current in the cell, inserted between $M_1$ and $M_2$ and connected to a source terminal of transistor $M_2$.

Typically, the transistor cell includes PMOS transistors.

Typically, the cascaded current arrangement includes a biasing voltage $V_{bias}$ attached to a source terminal of the first PMOS transistor of the first transistor cell with drain terminals of all the transistors of each cell connected to ground.

Typically, n-wells of the PMOS transistors of the transistor cells are connected to their respective source terminals.

Typically, the cascaded arrangement includes a number of unity gain amplifiers for driving the n-wells of successive transistor cells in the cascaded arrangement.

Typically, the impedance transistor is driven via an amplifier arranged in a negative feedback loop with a positive input terminal thereof connected to $V_{bias}$ and a negative terminal thereof connected to an output of a unity gain amplifier of a last transistor cell.

In a sixth broad form, the present invention provides a method for biasing a transistor amplifier with a DC-voltage signal, said amplifier having a first input terminal, a second input terminal, and an output terminal coupled to the second input terminal, the method comprising:
operatively coupling a sensor capacitor and parallel impedance transistor to the first input terminal, the transistor and capacitor forming a low-pass filter, and a biasing circuit to the impedance transistor, the biasing circuit including a cascaded current arrangement configured to subdivide a reference current into smaller currents for selectively generating voltage potentials for biasing the impedance transistor to adjustably filter a noise component of the DC-voltage signal via the low-pass filter before the DC-voltage signal is provided to the first input terminal; and selectively adjusting the DC-voltage signal with the biasing circuit to filter the noise component.

In a seventh broad form, the present invention provides for a device for biasing a transistor amplifier with a DC-voltage signal, the transistor amplifier having a first input terminal, a second input terminal, and an output terminal coupled to the second input terminal, wherein said device comprises:

an impedance transistor forming part of a low-pass filter; and a biasing circuit configured to controllably vary the DC-voltage signal for operatively biasing the amplifier, the biasing circuit including a cascaded current arrangement configured to subdivide a reference current into smaller currents for selectively generating voltage potentials for biasing the impedance transistor to adjustably filter a noise component of the DC-voltage signal via the low-pass filter before the DC-voltage signal is provided to the first input terminal.

The present invention also provides a method to precisely control the gate and source voltage of MOS transistors to generate a particular impedance in the transistors. This is done by using a cascade current source to subdivide a reference current to much smaller currents. The terminals of the transistors of the smaller currents can be selectively tapped to obtain voltage potentials for biasing an identical transistor used as the impedance.

BRIEF DESCRIPTION OF THE DRAWINGS

The present invention will become more fully understood from the following detailed description of a preferred but non-limiting embodiment thereof, described in connection with the accompanying drawings, wherein.

DETAILED DESCRIPTION OF EMBODIMENTS OF THE INVENTION

Figure 1:
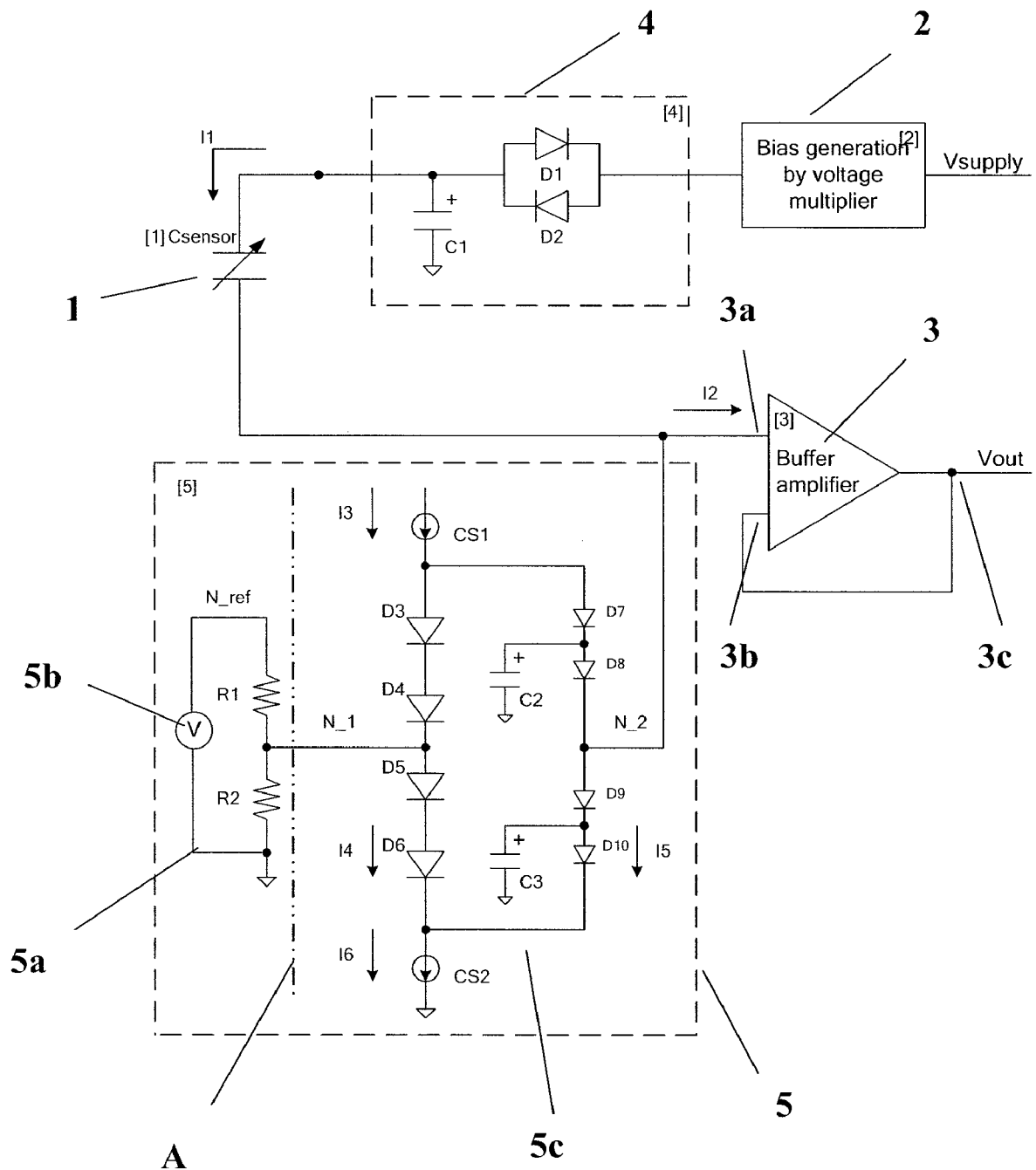
FIG. 1 shows a circuit diagram of a first embodiment of the present invention operatively interfaced with a buffer amplifier.

Referring firstly to FIG. 1, a first embodiment of a device for use in biasing a transistor amplifier with a DC-voltage signal is shown operatively coupled to a buffer amplifier (3). The device and buffer amplifier (3) are typically fabricated on an integrated circuit.

In one embodiment, the buffer amplifier (3) is a FET amplifier having a first (positive) input terminal (3a), a second (negative) input terminal (3b) and an output terminal (3c).

The output terminal (3c) is bootstrapped to the second input terminal (3b) via a feedback loop (not shown) to form a unity-gain or buffer amplifier.

A capacitive sensor (1) is operatively coupled to the first input terminal (3a) of the buffer amplifier (3). By way of example only, the capacitive sensor (1) can be part of an electret microphone. The capacitive sensor's (1) capacitance varies according to a received input signal—hereinafter referred to as $V_{supply}$—which is to be transduced.

$V_{supply}$ is fed to the capacitive sensor (1) from a voltage-multiplier device (2) which is arranged in series with the capacitive sensor (1). The voltage multiplier device (2) generates a high voltage bias for the capacitive sensor (1) from a relatively low $V_{supply}$ signal.

A low-pass filter (4) is operatively coupled between the voltage multiplier device (2) and the capacitive sensor (1) which filters out a voltage ripple in $V_{supply}$ before $V_{supply}$ is fed to the capacitive sensor (1). The voltage ripple is produced during voltage step-up conversion of $V_{supply}$ by the voltage multiplier device (2).

The low-pass filter (4) includes a capacitor (C1) operatively coupled with a first and second diode (D1,D2). More specifically, the first and second diodes (D1,D2) are coupled in parallel between a positive terminal of the capacitor (C1) and an output terminal of the voltage multiplier device (2). The negative terminal of the low-pass filter capacitor (C1) is grounded. The diodes (D1,D2) are arranged in reverse polarity relative to each other whilst in the parallel configuration. The relatively high impedances of the diodes (D1,D2) provide for an extremely-low cut-off frequency which reduces the effects of voltage ripple in $V_{supply}$ before $V_{supply}$ is fed to the capacitive sensor (1).

The diodes D1 and D2 of the low-pass filter are a proprietary configuration which form a very large impedance, yet with a relatively small area. A large impedance is provided by the combination of the diodes (D1,D2) in parallel when current I1 is very small. In the present example, the current I1 will be small (ie in the sub-pico range) given that the diodes (D1,D2) are being used in association with a MEMS (MicroElectroMechanical Systems) sensor. The large impedance value provided by this diode configuration (D1,D2) is advantageous compared to the prior art in that with the prior art, an integrated circuit resistor which would otherwise be used to perform the same function as the diodes would tend to occupy an area of the integrated circuit chip which is considerably larger than is occupied by the diode-pair arrangement.

The first embodiment device also includes a biasing circuit (5) which is operatively coupled to the first input terminal (3a) of the buffer amplifier (3) in parallel with the capacitive sensor (1). The biasing circuit (5) includes a resistor-divider (5a) arrangement which can selectably set a bias-voltage at Node (N_1) as shown in FIG. 1 by setting resistors R1 and R2 to tap a voltage bias source (5b).

The biasing circuit (5) also includes a sub-circuit (5c) represented by the circuitry to the right of imaginary line (A) in FIG. 1. The sub-circuit (5c) includes a plurality of diodes or diode-connected transistors and capacitors which are configured to mirror the voltage bias of node (N_1) at an output node (N_2) of the sub-circuit. At node (N_2), the supply noise produced by $V_{supply}$, and thermal noise are substantially removed by the diodes D7 to D10 in combination with the capacitors C2 to C3.

Advantageously, the first embodiment device not only enables a precision variable DC-voltage bias signal to be applied to the buffer amplifier (3), but also allows for noise to be effectively removed from the DC-voltage bias signal before it is applied to the buffer amplifier (3). Before outlining mathematically how this is achieved, the following operational conditions of the first embodiment device should be considered:

(i) Current sources CS1 (current I3) and CS2 (current I6) are matched current sources.
(ii) [R(D3)+R(D4)]:[R(D5)+R(D6)]=[R(D7)+R(D8)]:[R(D9)+R(D10)]
(iii) I4>I5 if a physical area of diode (D3, D4, D5, D6)>physical area of diodes (D7, D8, D9, D10). The ratio is same as ratio of diode areas.
(iv) Capacitors C2 and C3 are used to stabilise the DC level at the node of (D7,D8) and the node of (D9,D10) respectively.
(v) C2 and C3 together with D7 and D10 provide low pass filtering of noise from the biasing network (5), in particular from the current sources CS1 and CS2, voltage reference at node (N_ref) of voltage supply (5b) and resistive divider (R1:R2).

Thus, based on the above conditions, it follows that:

Voltage at node (N_1)=Voltage at node (N_ref)*(R2/(R1+R2))

Because of operational condition (ii) above, Voltage at node (N_1)=Voltage at node (N_2).

Because of operational condition (iii) above, current I5 can be set to a relatively small value with proper adjustment of current sources CS1 and CS2 whereby it becomes temperature independent. This implies that the effective resistance of D7, D8, D9, D10 are temperature insensitive.

As a result of the above, Voltage at node (N_2)=Voltage at node (N_ref)*(R2/(R1+R2)).

It would be appreciated by a person skilled in the art that the Voltage at (N_2) has very small noise injected by the voltage supply (5b) and current sources (CS1,CS2), and no thermal noise generated by resistor divider (5a). The effective resistance of node (N_2) is therefore substantially temperature insensitive.

The arrangement of the passive components (eg. capacitors, resistors and current sources) in the biasing circuit (5) as shown in FIG. 1 is configured so that the effective impedance of the diodes (D3-D10) can be controlled within very small variation by adjusting current sources CS1 and CS2 which pass currents through the diodes (D3-D10). The biasing circuit (5) is also relatively less susceptible to changes in temperature and leakage current due to the parallel replication of diodes (D3-D10).

Figure 2:
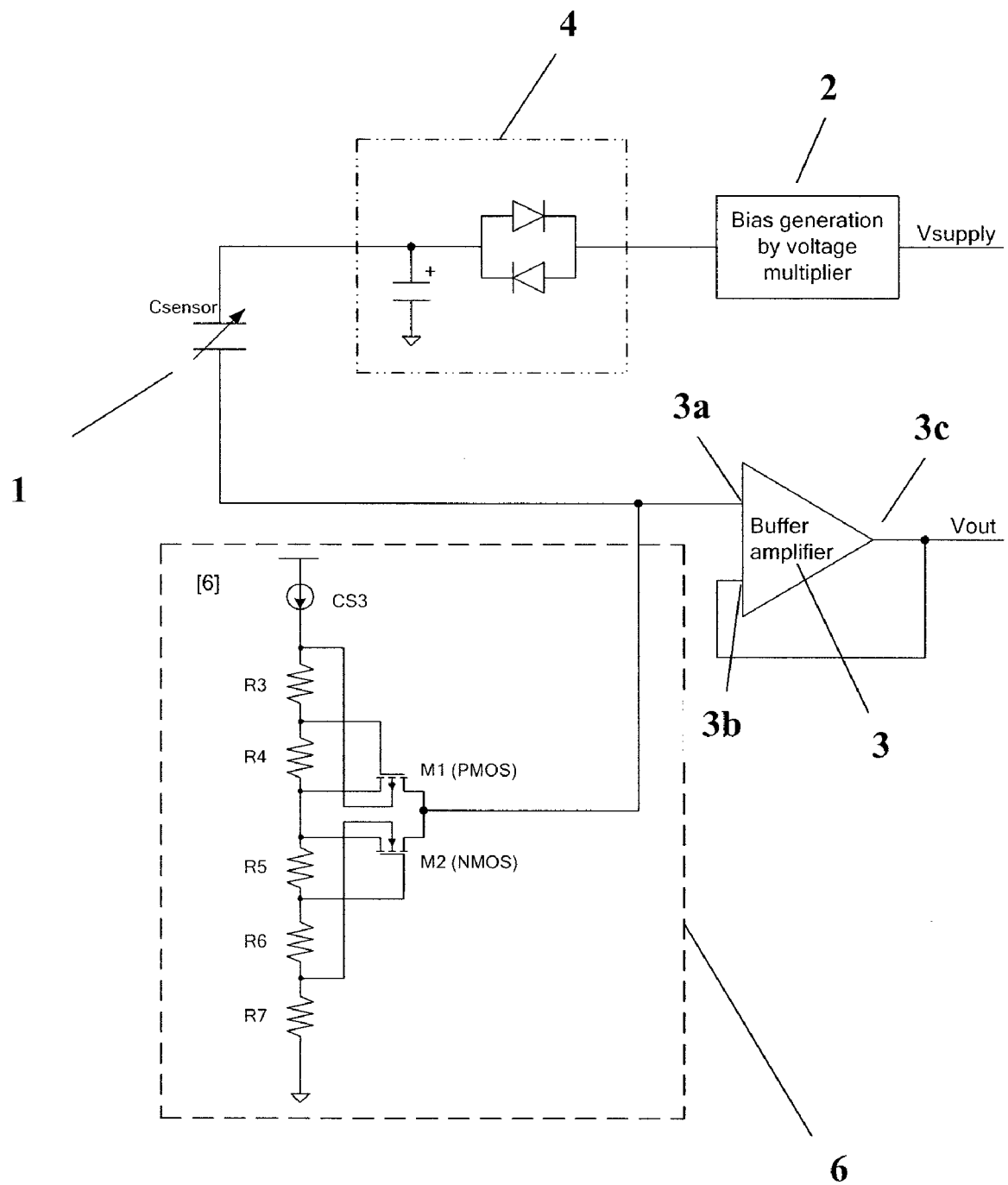
FIG. 2 shows a circuit diagram of a second embodiment of the present invention operatively interfaced with a buffer amplifier.

FIG. 2 of the drawings depicts a second embodiment device operatively coupled to a buffer amplifier (3).

It is a low pass network consisting of resistors (R3-R7), current source (CS3) and MOSFETs (M1, M2). Current source CS3 provides a bias current to resistors R3, R4, R5, R6 and R7 whereby a fixed voltage bias is able to be selected. As shown in FIG. 2, the configuration of M1, which is a PMOS device, and M2, which is an NMOS device, combines to act as very high value impedance elements. The conductivity of M1 and M2 is controlled by the respective gate voltages applied to M1 and M2 and determined by the sub-threshold properties of M1 and M2.

At an application level after the design is fabricated, the conductivity of M1 and M2 can be varied by trimming the resistor R4 and R5 or by connecting the gates of M1 and M2 to different potentials on the resistive ladder so as to alter an overdrive potential between gate-to-source of M1 and M2 respectively.

The low-pass filtering effect is provided by the combination of resistance in M1, M2 and the capacitor $C_{sensor}$. This can be made arbitrarily low (limited by the leakage of the junction leakage of M1 and M2) by adjusting the subthreshold conduction of M1 and M2. This can effectively reduce the in band noise for the signal of interest.

Figure 5:
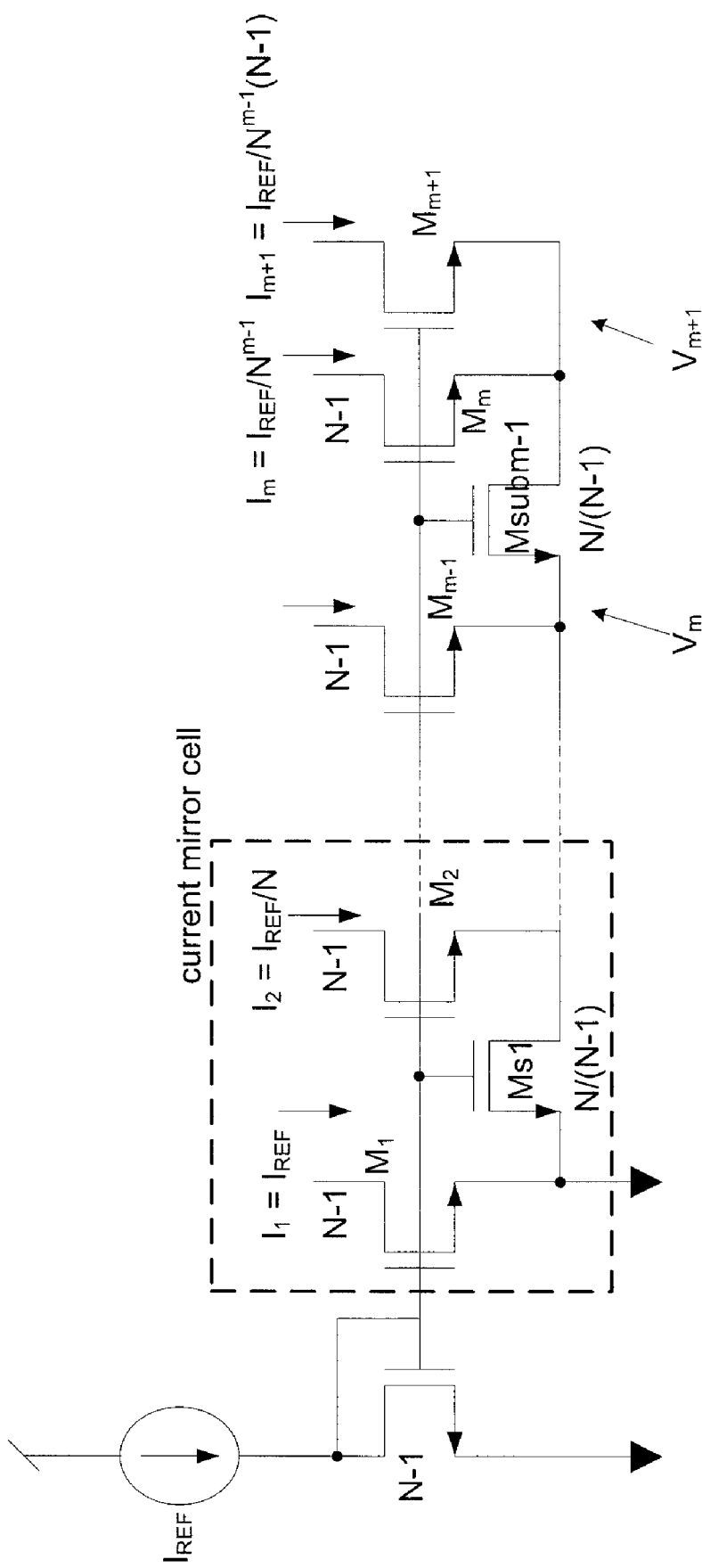
FIG. 5 shows a prior art circuit for accurately subdividing a reference current source to extremely small fractions.

An article by Bernabé Linares-Barranco entitled "On the Design and Characterization of Femtoampere Current-mode Circuits" (IEEE Journal of Solid-State Circuits, Vol 38, No. 8, 2003) (hereinafter "Bernabé Linares-Barranco"), shows a circuit consisting of a cascade of transistors for generation of extremely low current. FIG. 5 shows the circuit of Bernabé Linares-Barranco. This circuit enables a reference current $I_{REF}$ to be subdivided accurately by m number of stages to $I_{REF}/N_{M-1}$.

The circuit of Bernabé Linares-Barranco operates by using m number of cascaded transistor current mirror cells, as shown. Each current mirror cell includes transistors $M_1$, $M_{s1}$ and $M_2$. A transistor $M_{s1}$ of W/L ratio of N/N−1 where N is the ratio of current in the cell, is inserted to the source of the mirror transistor $M_2$. The current that flows through $M_2$ causes a voltage drop and hence decreases the gate to source voltage of $M_2$ in such a way that the desired current ratio is achieved. A cascade of such transistor current mirror cells provides the current division effect. The division is with respect to the reference current source Iref. By varying Iref, the current in each of the cells can be varied.

Figure 6:
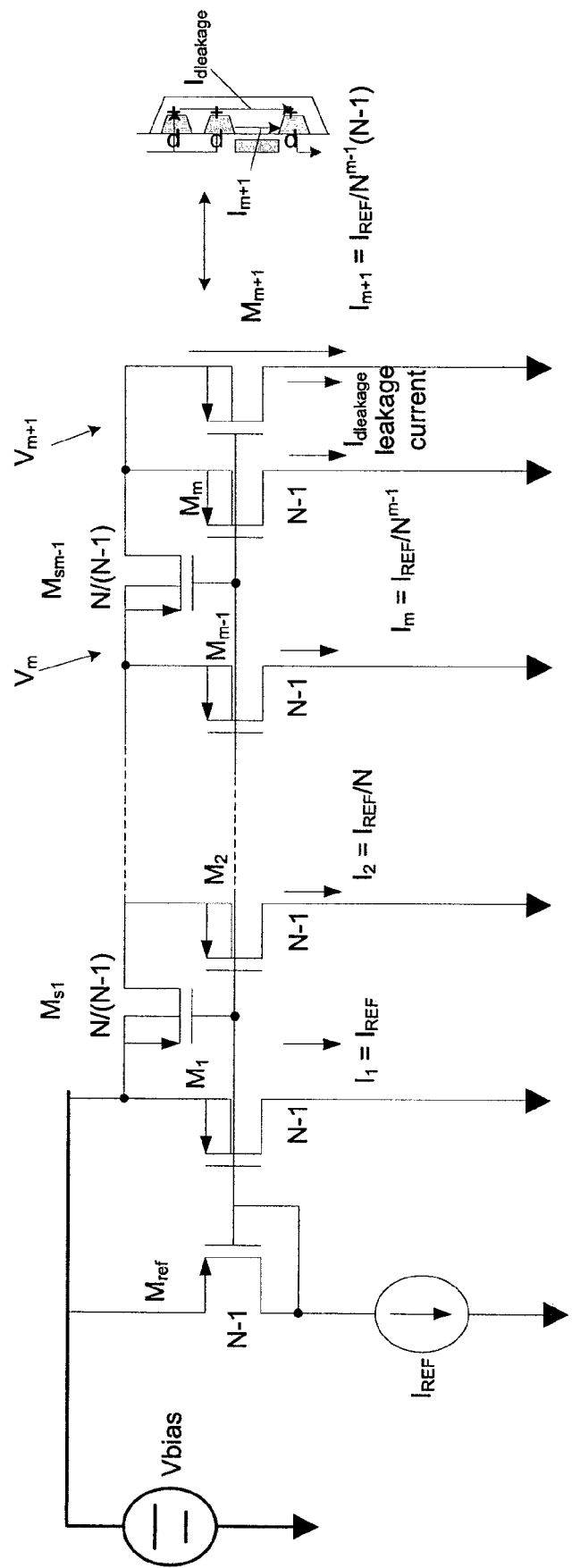
FIG. 6 shows a circuit based on the circuit of FIG. 5 using complementary P-MOS transistors to produce a floating current source.

FIG. 6 shows a circuit using the circuit of FIG. 5 to generate a floating current source fixed to a certain bias. The NMOS transistors of FIG. 5 are replaced by PMOS transistors. A biasing voltage $V_{bias}$ is attached to the source of the first PMOS transistor $M_1$ and $M_{ref}$. This ties the sources of all the transistors close to a potential $V_{bias}$ assuming the voltage drop across the $M_{sX}$ transistors to be small and negligible. The drains of the current source transistors are shown connected to ground. This is done because the currents so generated are not being used. It is merely the intention here to derive the potential necessary for biasing a MOSFET with a given impedance and being held at a certain bias potential.

In FIG. 6, the n-wells of the PMOS transistors are shown connected to their source. A cross section of the PMOS transistor in the latter part of this current source is shown in the right hand diagram of FIG. 6. It can be shown that the current that flows through the structure consists of two currents, namely a normal current $I_{m+1}$ and a drain leakage current $I_{dleakage}$. The leakage current can be in the sub-picoampere range depending on the size of the junction. While for large $I_m$ this connection is working, in this particular application, especially at node $V_{m+1}$ and $V_m$ where the currents flowing are extremely small and in the picoampere range, the well leakage into the drain of transistors $M_m$ and $M_{m+1}$, can no longer be neglected and can seriously deteriorate the accuracy of the current sources. Particularly because the drain to well voltage is large, the leakage has to be supplied from a previous stage. This leakage current can accumulate from one stage to another, creating an error. This is an accumulative error on the current division effect.

Figure 3:
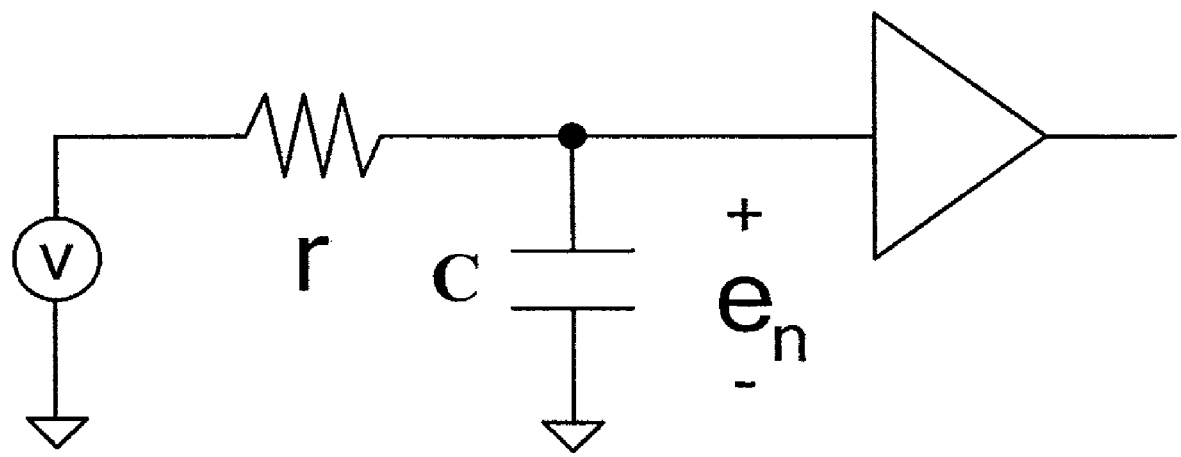
FIG. 3 shows a prior art biasing network.
Figure 7:
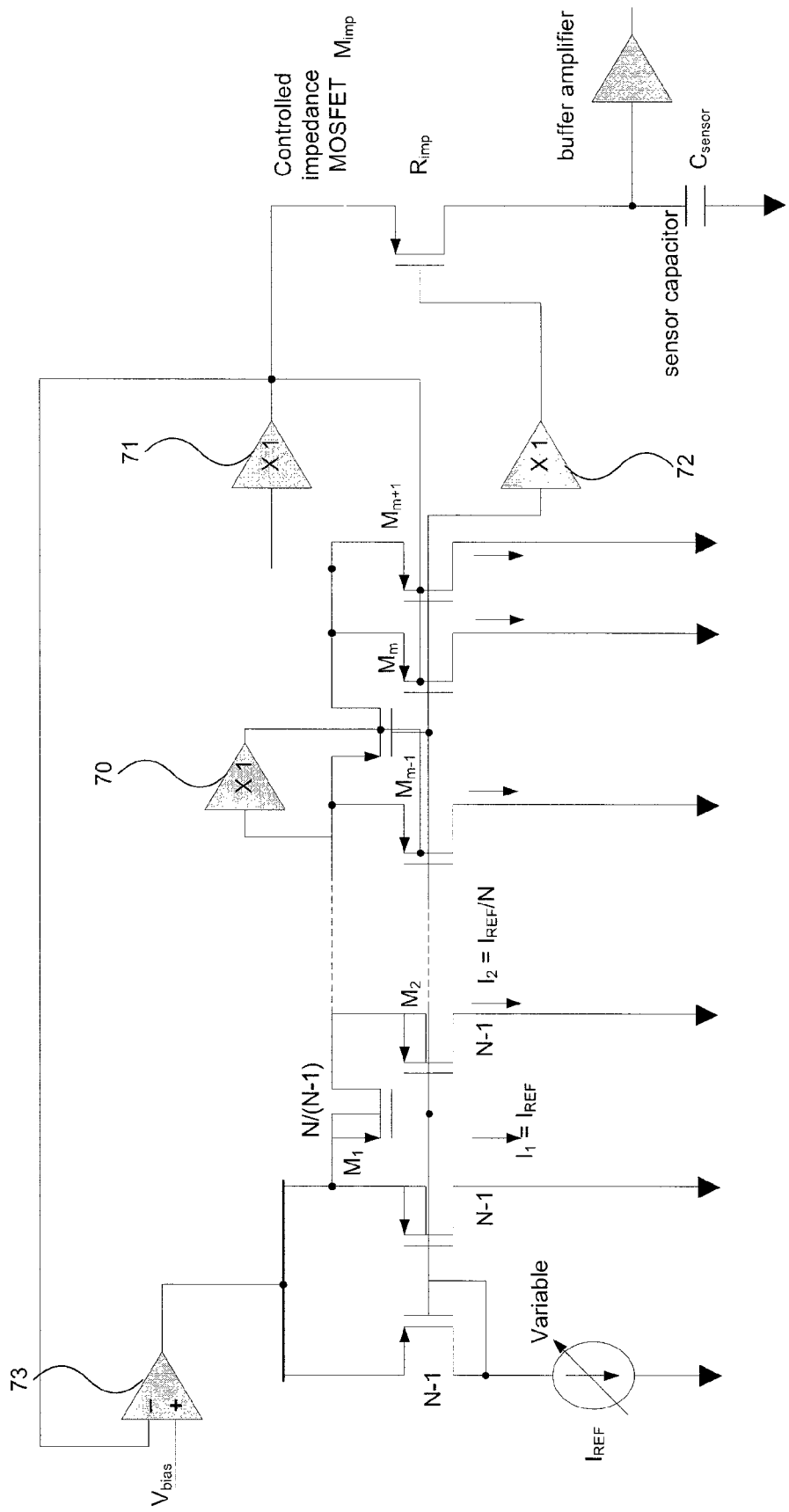
FIG. 7 shows a circuit whereby the N-well of the P-MOS transistors of FIG. 6 are buffered using unity gain amplifier. The amplifiers provide the bias to a controlled impedance transistor

FIG. 7 shows the application of the circuit of FIG. 6 in relation to the network of FIG. 3. The circuitry of FIG. 6 is used as a new current source for precise impedance generation via controlled impedance MOSFET $M_{imp}$. MOS transistor input unity gain amplifiers or buffers 70, 71 are used to drive the n-wells of following transistors, as shown. The buffers 70, 71 tap voltages from the previous stages, as shown. Since they are MOSFET input amplifiers 70, 71, they do not draw a current and hence prevents any leakage errors. By providing the leakage currents to the drain junctions of the current source transistors, the current division ratios are generally only minutely perturbed from their designed values.

The bias voltage to be applied to one end of the impedance transistor $M_{imp}$ is supplied via the amplifier 73, as shown.

This amplifier 73 is put in a negative feedback mode with the positive input connected to $V_{bias}$ (see FIG. 6) and the negative input of 73 connected to the output terminal of buffer 71. The negative feedback forces the output of 73 in such a matter that the output of 71 tracks $V_{bias}$. This provides a fixed bias to the source of the impedance transistor $M_{imp}$.

Another buffer 72 obtains the precise bias potential of the gate of the reference transistor $M_m$ and applies it to the gate of $M_{imp}$, as shown.

With source and gate potential fixed and no current flowing through the transistor $M_{imp}$, the impedance of $M_{imp}$ is determined uniquely by its ratio to $M_m$, the bias potential $V_{bias}$ and reference current source $I_{ref}$. These variables can be varied at will to change the biasing point and impedance level of the transistor. Since $I_{ref}$ can be designed to be relatively independent of technology-dependent parameter variations and/or supply voltage variations, the current through $M_{imp}$ is accurately proportional and independent of the same factors. As the impedance of $M_{imp}$ is only dependent on its bias, it is accurately determined without regard to the same factors and can lead to higher yield of the circuits.

The channel impedance (Rimp) of $M_{imp}$ and the sensor capacitor Csensor forms the low pass filter and the noise voltage 'trapped' within this low pass system is the well known kT/C noise where k is the Boltzmann constant, T the absolute temperature and C the value Csensor. The total noise energy is independent of Rimp and depends only on Csensor. However, as shown previously, the shape or the −3 dB frequency of this low pass filter system can be trimmed by varying Rimp. By suitably shifting f−3 dB towards lower frequency (without jeopardizing the biasing point of the amplifier), noise energy can be confined within certain low frequency space. By suitably applying signal filters the noise can be made negligible.

Figure 4:
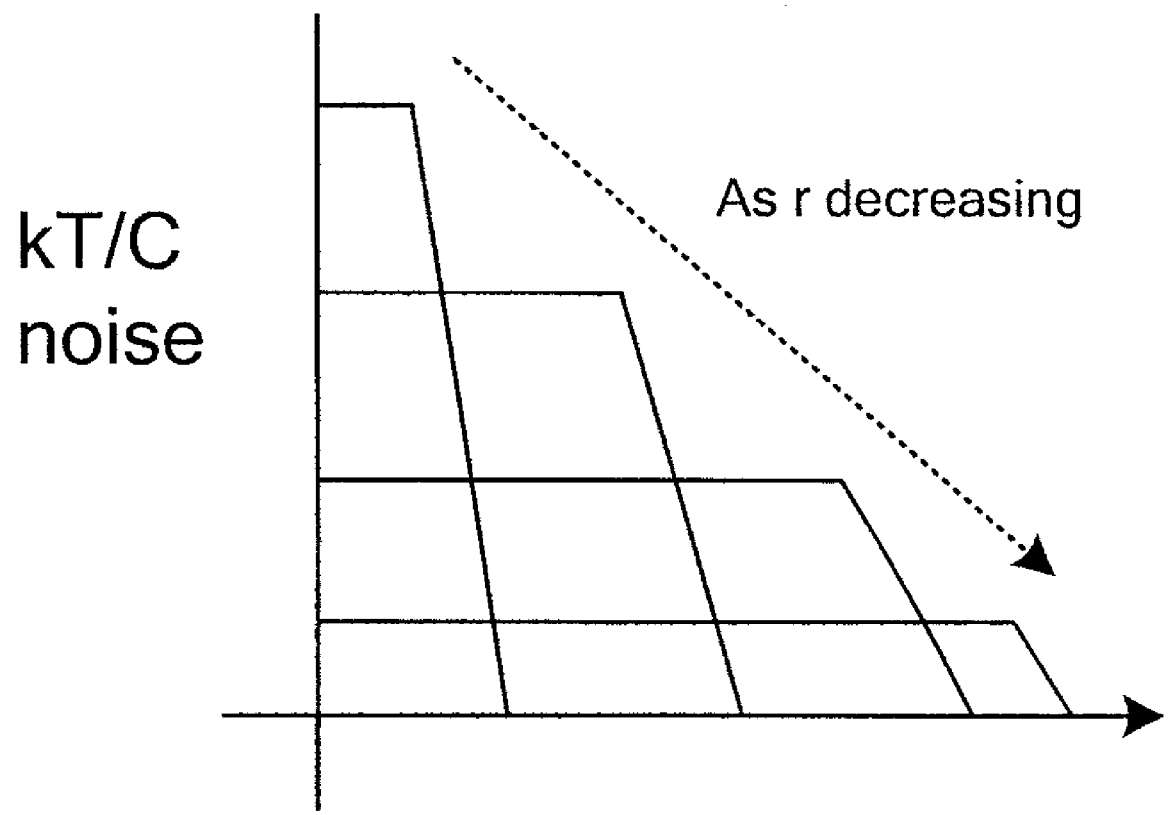
FIG. 4 shows a graph representing the noise generated from the prior art biasing network shown in FIG. 3, as a function of decreasing impedance.

The function of $M_{imp}$ is such that it is a precisely controlled replica of the resistance r shown in FIG. 3. This lends the corner frequency of the low pass filter in FIG. 4 controllable to a high precision. This is important for the control of the noise content that falls within a specific range of the frequency spectrum and is particularly important with its application towards A-D weighing filters in audio processing.

Those skilled in the art will appreciate that the invention described herein is susceptible to variations and modifications other than those specifically described without departing from the scope of the invention. All such variations and modification which become apparent to persons skilled in the art, should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed is:

1. A circuit arrangement for biasing a transistor amplifier with a DC-voltage signal, the transistor amplifier having a first input terminal, a second input terminal, and an output terminal coupled to the second input terminal, wherein said circuitry comprises:
   a sensor capacitor connected to the first input terminal;
   an impedance transistor arranged in parallel with said capacitor, the transistor and capacitor forming a low-pass filter; and
   a biasing circuit configured to controllably vary the DC-voltage signal for operatively biasing the amplifier, the biasing circuit including a cascaded current arrangement configured to subdivide a reference current into smaller currents for selectively generating voltage potentials for biasing the impedance transistor to adjustably filter a noise component of the DC-voltage signal via the low-pass filter before the DC-voltage signal is provided to the first input terminal.

2. A circuit arrangement of claim 1, wherein the cascaded current arrangement includes a number of transistor cells to facilitate subdivision of a reference current $I_{REF}$ by m number of stages to $I_{REF}/N_{M-1}$.

3. A circuit arrangement of claim 2, wherein each transistor cell includes two transistors $M_1$ and $M_2$ arranged in parallel with a transistor $M_{s1}$ having a W/L ratio of N/N−1, where N is the ratio of current in the cell, inserted between $M_1$ and $M_2$ and connected to a source terminal of transistor $M_2$.

4. A circuit arrangement of claim 3, wherein the transistor cell includes PMOS transistors.

5. A circuit arrangement of claim 4, wherein the cascaded current arrangement includes a biasing voltage $V_{bias}$ attached to a source terminal of the first PMOS transistor of the first transistor cell with drain terminals of all the transistors of each cell connected to ground.

6. A circuit arrangement of claim 5, wherein n-wells of the PMOS transistors of the transistor cells are connected to their respective source terminals.

7. A circuit arrangement of claim 6, wherein, the cascaded arrangement includes a number of unity gain amplifiers for driving the n-wells of successive transistor cells in the cascaded arrangement.

8. A circuit arrangement of claim 7, wherein the impedance transistor is driven via an amplifier arranged in a negative feedback loop with a positive input terminal thereof connected to $V_{bias}$ and a negative terminal thereof connected to an output of a unity gain amplifier of a last transistor cell.

9. A method for biasing a transistor amplifier with a DC-voltage signal, said amplifier having a first input terminal, a second input terminal, and an output terminal coupled to the second input terminal, the method comprising:
   operatively coupling a sensor capacitor and parallel impedance transistor to the first input terminal, the transistor and capacitor forming a low-pass filter, and a biasing circuit to the impedance transistor, the biasing circuit including a cascaded current arrangement configured to subdivide a reference current into smaller currents for selectively generating voltage potentials for biasing the impedance transistor to adjustably filter a noise component of the DC-voltage signal via the low-pass filter before the DC-voltage signal is provided to the first input terminal; and
   selectively adjusting the DC-voltage signal with the biasing circuit to filter the noise component.

10. A device for biasing a transistor amplifier with a DC-voltage signal, the transistor amplifier having a first input terminal, a second input terminal, and an output terminal coupled to the second input terminal, wherein said device comprises:
   an impedance transistor forming part of a low-pass filter; and
   a biasing circuit configured to controllably vary the DC-voltage signal for operatively biasing the amplifier, the biasing circuit including a cascaded current arrangement configured to subdivide a reference current into smaller currents for selectively generating voltage potentials for biasing the impedance transistor to adjustably filter a noise component of the DC-voltage signal via the low-pass filter before the DC-voltage signal is provided to the first input terminal.

11. A low-pass filter adapted for use in filtering out a voltage ripple in a supply voltage signal, the voltage ripple being generated by a voltage multiplier device during voltage step-up conversion of the supply voltage signal before said supply voltage signal is fed to a capacitive sensor, the low-pass filter including a capacitor operatively coupled with a first and second diode, said first and second diodes being adapted for operative coupling in parallel between a terminal of the capacitor and an output terminal of the voltage multiplier device, said diodes being arranged in reverse polarity relative to each other in parallel.

12. A low-pass filter as claimed in claim 11, wherein said low-pass filter is fabricated on an integrated circuit chip.

13. A low-pass filter as claimed in claim 11, wherein the capacitive sensor and the voltage multiplier device are fabricated on the integrated circuit chip.

* * * * *